US011152470B2

United States Patent
Nishio et al.

(10) Patent No.: US 11,152,470 B2
(45) Date of Patent: Oct. 19, 2021

(54) METHOD FOR MANUFACTURING SEMICONDUCTOR DEVICE, METHOD FOR MANUFACTURING SUBSTRATE, SEMICONDUCTOR DEVICE, SUBSTRATE, AND MANUFACTURING APPARATUS OF SUBSTRATE

(71) Applicant: KABUSHIKI KAISHA TOSHIBA, Minato-ku (JP)

(72) Inventors: Johji Nishio, Machida (JP); Chiharu Ota, Kawasaki (JP); Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/566,138

(22) Filed: Sep. 10, 2019

(65) Prior Publication Data
US 2020/0251560 A1 Aug. 6, 2020

(30) Foreign Application Priority Data
Feb. 4, 2019 (JP) .............................. JP2019-018140

(51) Int. Cl.
H01L 29/16 (2006.01)
H01L 29/20 (2006.01)

(52) U.S. Cl.
CPC .......... *H01L 29/1608* (2013.01); *H01L 29/20* (2013.01)

(58) Field of Classification Search
CPC ........... H01L 29/1608; H01L 21/67213; H01L 21/02447; H01L 21/02378;
(Continued)

(56) References Cited

U.S. PATENT DOCUMENTS 6,734,461 B1 * 5/2004 Shiomi ................... C30B 23/00
257/77
9,373,686 B2 6/2016 Nishio et al.
(Continued)

FOREIGN PATENT DOCUMENTS

JP 2011-109018 A 6/2011
JP 4857697 B2 1/2012
(Continued)

OTHER PUBLICATIONS

Tawara, T. et al., "Short minority carrier lifetimes in highly nitrogen-doped 4H—SiC epilayers for suppression of the stacking fault formation in PiN diodes," Journal of Applied Physics, vol. 120, No. 115101, 2016, 8 pages.

*Primary Examiner* — Bilkis Jahan
*Assistant Examiner* — Victor V Barzykin
(74) *Attorney, Agent, or Firm* — Oblon, McClelland, Maier & Neustadt, L.L.P.

(57) ABSTRACT

According to one embodiment, a method for manufacturing a semiconductor device is disclosed. The method can include a first process of causing a stacking fault of a first semiconductor layer to expand. The first semiconductor layer includes silicon carbide and a first element and is provided on a base body including silicon carbide. The first element includes at least one selected from the group consisting of N, P, and As. The method can include a second process of forming a second semiconductor layer on the first semiconductor layer after the first process. The second semiconductor layer includes silicon carbide and the first element. The method can include a third process of forming a third semiconductor layer on the second semiconductor layer. The third semiconductor layer includes silicon carbide and a second element. The second element includes at least one selected from the group consisting of B, Al, and Ga.

12 Claims, 7 Drawing Sheets

(58) Field of Classification Search
CPC .......... H01L 21/02529; H01L 29/6606; H01L 29/8611; H01L 29/0873; H01L 29/66068; H01L 29/7395; H01L 29/7802; H01L 29/1079; H01L 29/7827; H01L 29/20; H01L 29/32; H01L 29/045
See application file for complete search history.

(56) References Cited

U.S. PATENT DOCUMENTS

| | | | |
|---|---|---|---|
| 2014/0252378 A1* | 9/2014 | Ota | H01L 29/7395 |
| | | | 257/77 |
| 2016/0268381 A1* | 9/2016 | Ota | H01L 29/34 |
| 2018/0061960 A1* | 3/2018 | Kawada | H01L 21/02378 |
| 2018/0358444 A1* | 12/2018 | Ryo | H01L 29/32 |
| 2019/0040545 A1* | 2/2019 | Nakamura | C30B 25/186 |
| 2019/0157395 A1* | 5/2019 | Schulze | H01L 29/8611 |
| 2019/0244814 A1* | 8/2019 | Saito | C30B 33/02 |
| 2020/0312966 A1* | 10/2020 | Tawara | H01L 29/167 |

FOREIGN PATENT DOCUMENTS

| | | |
|---|---|---|
| JP | 2014-146748 A | 8/2014 |
| JP | 2015-2277 A | 1/2015 |
| JP | 2015-86123 A | 5/2015 |
| JP | 2019-140184 A | 8/2019 |

\* cited by examiner

METHOD FOR MANUFACTURING SEMICONDUCTOR DEVICE, METHOD FOR MANUFACTURING SUBSTRATE, SEMICONDUCTOR DEVICE, SUBSTRATE, AND MANUFACTURING APPARATUS OF SUBSTRATE

CROSS-REFERENCE TO RELATED APPLICATIONS

This application is based upon and claims the benefit of priority from Japanese Patent Application No. 2019-018140, filed on Feb. 4, 2019; the entire contents of which are incorporated herein by reference.

FIELD

Embodiments described herein relate generally to a method for manufacturing a semiconductor device, a method for manufacturing a substrate, a semiconductor device, a substrate, and a manufacturing apparatus of the substrate.

BACKGROUND

For example, there is a semiconductor device that uses a substrate including silicon carbide (SiC). Stable characteristics of the semiconductor device are desirable.

DETAILED DESCRIPTION

According to one embodiment, a method for manufacturing a semiconductor device is disclosed. The method can include a first process of causing a stacking fault of a first semiconductor layer to expand. The first semiconductor layer includes silicon carbide and a first element and is provided on a base body including silicon carbide. The first element includes at least one selected from the group consisting of N, P, and As. The method can include a second process of forming a second semiconductor layer on the first semiconductor layer after the first process. The second semiconductor layer includes silicon carbide and the first element. The method can include a third process of forming a third semiconductor layer on the second semiconductor layer. The third semiconductor layer includes silicon carbide and a second element. The second element includes at least one selected from the group consisting of B, Al, and Ga.

According to one embodiment, a method for manufacturing a semiconductor device is disclosed. The method can include a first process of irradiating at least one selected from the group consisting of an ultraviolet ray and an electron beam on a first semiconductor layer provided on a base body including silicon carbide. The first semiconductor layer includes silicon carbide and a first element. The first element includes at least one selected from the group consisting of N, P, and As. The method can include a second process of forming a second semiconductor layer on the first semiconductor layer after the first process. The second semiconductor layer includes silicon carbide and the first element. The method can include a third process of forming a third semiconductor layer on the second semiconductor layer. The third semiconductor layer includes silicon carbide and a second element. The second element includes at least one selected from the group consisting of B, Al, and Ga.

According to another embodiment, a method for manufacturing a substrate is disclosed. The method can include a first process of irradiating at least one selected from the group consisting of an ultraviolet ray and an electron beam on a first semiconductor layer provided on a base body including silicon carbide. The first semiconductor layer includes silicon carbide and a first element. The first element includes at least one selected from the group consisting of N, P, and As. The method can include a second process of forming a second semiconductor layer on the first semiconductor layer after the first process. The second semiconductor layer includes silicon carbide and the first element.

According to another embodiment, a semiconductor device includes a first semiconductor layer including silicon carbide and a first element, a second semiconductor layer including silicon carbide and the first element, and a third semiconductor layer including silicon carbide and a second element. The first element includes at least one selected from the group consisting of N, P, and As. The second element includes at least one selected from the group consisting of B, Al, and Ga. The second semiconductor layer is between the first semiconductor layer and the third semiconductor layer. The first semiconductor layer includes a stacking fault. The stacking fault has a first side aligned with a <-1100> direction. The first side contacts the second semiconductor layer.

According to another embodiment, a substrate includes a base body including silicon carbide, a first semiconductor layer including silicon carbide and a first element, and a second semiconductor layer including silicon carbide and the first element. The first element includes at least one selected from the group consisting of N, P, and As. The first semiconductor layer is between the base body and the second semiconductor layer. The first semiconductor layer includes a stacking fault. The stacking fault has a first side aligned with a <-1100> direction. The first side contacts the second semiconductor layer.

According to another embodiment, a manufacturing apparatus of a substrate includes a processing chamber including an inlet configured to introduce a source gas of silicon carbide, a stage provided inside the processing chamber, and an irradiation portion configured to irradiate at least one selected from the group consisting of an ultraviolet ray and an electron beam on a first semiconductor layer at a first temperature of 450° C. or less. A processing body is placed on the stage. The processing body includes the first semiconductor layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
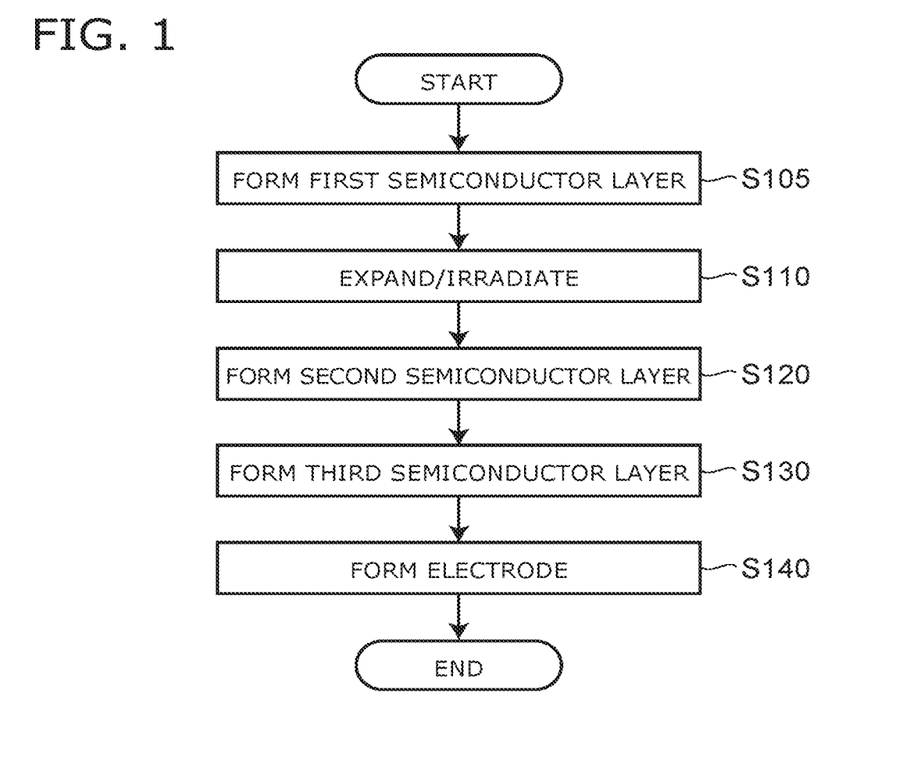
FIG. 1 is a flowchart illustrating a method for manufacturing a semiconductor device according to a first embodiment.

FIG. 1 is a flowchart illustrating a method for manufacturing a semiconductor device according to a first embodiment.

As shown in FIG. 1, the method for manufacturing the semiconductor device according to the embodiment includes a first process (step S110), a second process (step S120), and a third process (step S130). The manufacturing method according to the embodiment may further include other processes (other steps).

In the first process, for example, at least one selected from the group consisting of an ultraviolet ray and an electron beam is irradiated on a first semiconductor layer (step S110). For example, the first semiconductor layer is provided on a base body including silicon carbide. The first semiconductor layer includes silicon carbide, and a first element including at least one selected from the group consisting of N, P, and As. For example, the first semiconductor layer is of an n-type.

In the first process, for example, a stacking fault of the first semiconductor layer is caused to expand. For example, the stacking fault of the first semiconductor layer is caused to expand by irradiating the ultraviolet ray, the electron beam, or the like on the first semiconductor layer.

In the second process, a second semiconductor layer is formed on the first semiconductor layer after the first process (step S120). The second semiconductor layer includes silicon carbide and the first element recited above. For example, the second semiconductor layer is of the n-type.

In the third process, a third semiconductor layer is formed on the second semiconductor layer (step S130). The third semiconductor layer includes silicon carbide, and a second element including at least one selected from the group consisting of B, Al, and Ga. For example, the third semiconductor layer is of a p-type.

In the embodiment, the manufacturing method may further include a process of forming the first semiconductor layer on the base body recited above (step S105). In the embodiment, the manufacturing method may further include a process of forming an electrode (step S140).

In the embodiment, in the first process, the stacking fault of the first semiconductor layer is caused to expand by irradiating the ultraviolet ray, the electron beam, or the like on the first semiconductor layer; subsequently, the second semiconductor layer is formed. The stacking fault substantially does not expand in the second semiconductor layer. The characteristics of the semiconductor device can be stable thereby.

An example of the method for manufacturing the semiconductor device according to the embodiment will now be described.

FIG. 2A to FIG. 2E and FIG. 3A to FIG. 3D are schematic views illustrating the method for manufacturing the semiconductor device according to the first embodiment.

FIG. 2A, FIG. 2C, FIG. 3A, and FIG. 3C are plan views. FIG. 2B, FIG. 2D, FIG. 2E, FIG. 3B, and FIG. 3D are cross-sectional views. FIG. 2B is a cross-sectional view corresponding to FIG. 2A. FIG. 2D is a cross-sectional view corresponding to FIG. 2C. FIG. 3B is a cross-sectional view corresponding to FIG. 3A. FIG. 3D is a cross-sectional view corresponding to FIG. 3C.

Figure 2A:
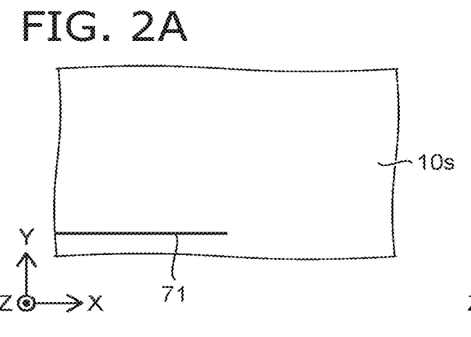
FIG. 2A to FIG. 2E are schematic views illustrating the method for manufacturing the semiconductor device according to the first embodiment.
Figure 2B:
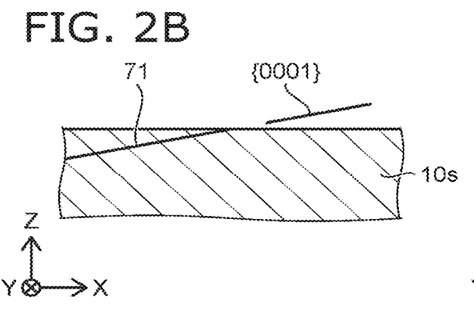

A base body $10s$ is prepared as shown in FIG. 2A and FIG. 2B. The base body $10s$ includes silicon carbide (SiC). The base body $10s$ is, for example, a SiC substrate. The base body $10s$ is, for example, a SiC bulk single-crystal substrate. In one example, the SiC that is included in the base body $10s$ is 4H—SiC.

A direction perpendicular to the front surface (the upper surface) of the base body $10s$ is taken as a Z-axis direction. One direction perpendicular to the Z-axis direction is taken as an X-axis direction. A direction perpendicular to the Z-axis direction and the X-axis direction is taken as a Y-axis direction. The base body $10s$ spreads along the X-Y plane.

For example, a basal plane dislocation 71 (BPD) exists inside the base body $10s$. The basal plane dislocation 71 is along the {0001} plane of the base body $10s$. The basal plane dislocation 71 propagates along the [11-20] direction of the SiC. The "-" in the notation of "[11-20]" means that the numeral after the "-" is marked with a "bar."

The front surface (the upper surface) of the base body $10s$ may be oblique to the {0001} plane of the SiC of the base body $10s$.

Figure 2C:
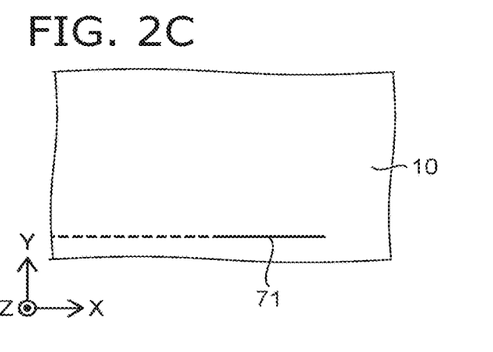
Figure 2D:
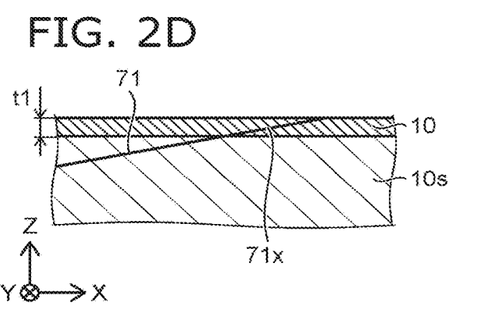

As shown in FIG. 2C and FIG. 2D, the first semiconductor layer 10 is provided on such a base body $10s$. For example, the first semiconductor layer 10 is formed by epitaxial growth. The first semiconductor layer 10 includes a basal plane dislocation $71x$ that is continuous with the basal plane dislocation 71 of the base body $10s$.

Figure 2E:
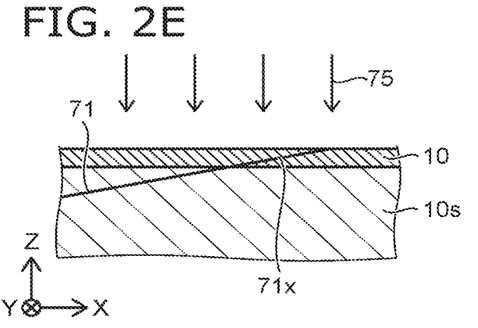

As shown in FIG. 2E, an energy beam 75 is irradiated on the first semiconductor layer 10. The energy beam 75 includes at least one selected from the group consisting of an ultraviolet ray and an electron beam. As described below, by irradiating the energy beam 75, a stacking fault that is based on the basal plane dislocation $71x$ is caused to expand. For example, the irradiation of the energy beam 75 corresponds to the first process.

Figure 3A:
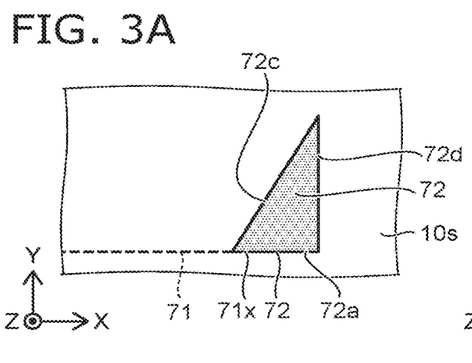
FIG. 3A to FIG. 3D are schematic views illustrating the method for manufacturing the semiconductor device according to the first embodiment.
Figure 3B:
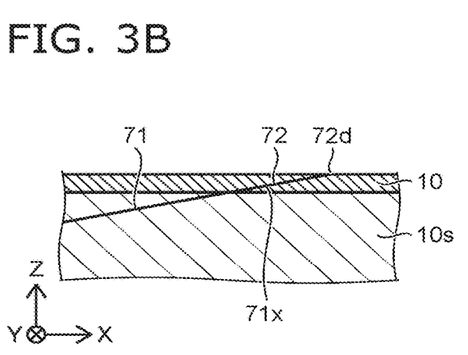

FIG. 3A and FIG. 3B illustrate the state after the stacking fault 72 has expanded based on the basal plane dislocation $71x$. As shown in FIG. 3A, the stacking fault 72 is substantially triangular (or trapezoidal) in the X-Y plane. One side $72a$ (a short side) of the triangle (or the trapezoid) is connected to the basal plane dislocation $71x$. Another side $72d$ (a long side) of the triangle (or the trapezoid) is aligned with a direction substantially perpendicular to the extension direction of the basal plane dislocation $71x$. As shown in FIG. 3B, the side $72d$ substantially reaches the upper surface of the first semiconductor layer 10. The angle between the side $72d$ and another side $72c$ (an oblique side) of the triangle (or the trapezoid) is substantially 30 degrees. This angle is based on the crystal structure of SiC.

For example, when the time of the first process illustrated in FIG. 2E is sufficiently long, the stacking fault 72 expands sufficiently; and the stacking fault 72 is substantially triangular. For example, if the time of the first process is short, the expansion of the stacking fault 72 is in an intermediate state; and the stacking fault 72 is trapezoidal.

Figure 3C:
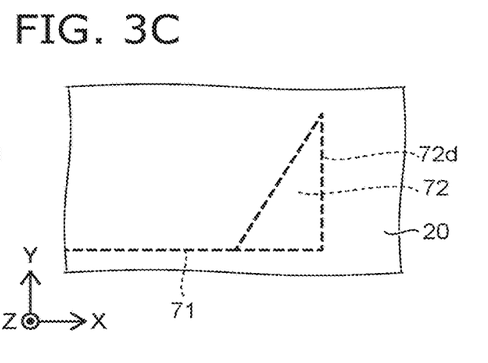
Figure 3D:
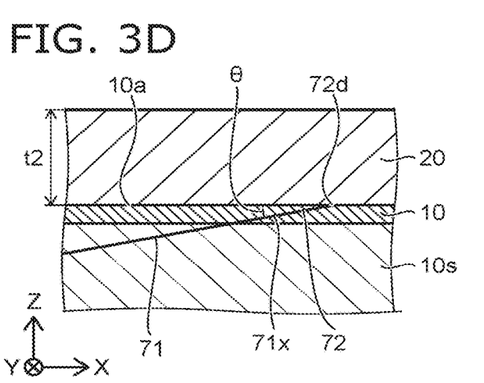

As shown in FIG. 3C and FIG. 3D, the second semiconductor layer 20 is formed on the first semiconductor layer 10. The second semiconductor layer 20 is epitaxially grown on the first semiconductor layer 10. The stacking fault 72 stops inside the first semiconductor layer 10. The basal plane dislocation 71 propagates into the first semiconductor layer 10 but substantially does not propagate into the second semiconductor layer 20. Thereby, low defects and a good crystal are obtained in the second semiconductor layer 20.

As shown in FIG. 3D, the side 72d of the stacking fault 72 (the long side of the triangle) contacts the interface between the first semiconductor layer 10 and the second semiconductor layer 20.

As shown in FIG. 3D, the first semiconductor layer 10 has a first surface 10a opposing the second semiconductor layer. For example, the first surface 10a is oblique to the {0001} plane of the SiC. The angle between the first surface 10a and the {0001} plane is taken as an angle θ. The angle θ is, for example, not less than 1 degree and not more than 10 degrees. In one example, the angle θ is about 4 degrees. In the drawings of the application, the angle θ may be illustrated as being large for easier viewing.

In the embodiment, in the first process, the stacking fault 72 that is based on the basal plane dislocation 71x generated by the propagation of the basal plane dislocation 71 of the base body 10s is caused to expand. For example, the expansion of the stacking fault 72 is performed by the irradiation of the energy beam 75. The expansion of the stacking fault 72 ends inside the first semiconductor layer 10. Then, the second semiconductor layer 20 is formed. Thereby, a configuration is obtained in which the first semiconductor layer 10 includes the stacking fault 72; and the second semiconductor layer 20 substantially does not include the stacking fault 72.

The stacking fault 72 inside the first semiconductor layer 10 is small. Therefore, a forward voltage Vf is substantially not affected. In the embodiment, the fluctuation of the forward voltage Vf is suppressed; and the forward voltage Vf is stable.

For example, the stacking fault 72 corresponds to a "1SSF" (single Shockley Stacking Fault). In the embodiment, for example, the growth of the SiC film (the first semiconductor layer 10 and the second semiconductor layer 20) is discontinued in the initial stage of the epitaxial growth. Namely, the first semiconductor layer 10 is formed. Then, the "1SSF" is formed by exciting the threading (penetrated, growin-in) basal plane dislocation due to the basal plane dislocation 71x based on the basal plane dislocation 71 of the base body 10s. For example, the excitation is performed by irradiating the energy beam 75. The Si-core partial dislocation substantially disappears at the end portion of the "1SSF." Mobile dislocations are suppressed thereby. Subsequently, the second semiconductor layer 20 is epitaxially grown. At least a portion of the second semiconductor layer 20 corresponds to a drift layer of the semiconductor device. According to the manufacturing method recited above, the stacking fault 72 inside the drift layer can be suppressed.

In the embodiment, a "1SSF" having a small surface area is generated inside the first semiconductor layer 10. The "1SSF" is immobilized. The effects on the electrical characteristics substantially can be ignored because the "1SSF" is extremely small compared to the entire drift layer which is thick.

Generally, in a power device based on SiC, holes that exceed the threshold density are injected due to the current injection when operating; and the stacking fault 72 expands easily. Thereby, for example, there are cases where the forward voltage Vf fluctuates.

In the embodiment, there are substantially no mobile dislocations. The "1SFF" is immobilized. Therefore, the expansion of the defects due to the current injection is suppressed. A stable forward voltage Vf is obtained. A semiconductor device (a power device) is obtained in which the characteristics can be stable.

Examples of the expansion of the stacking fault 72 will now be described.

FIG. 4A to FIG. 4E are schematic views illustrating states of the semiconductor device.

Figure 4A:
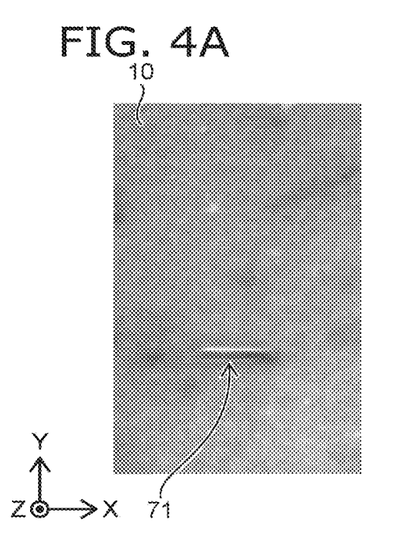
FIG. 4A to FIG. 4E are schematic views illustrating states of the semiconductor device.
Figure 4B:
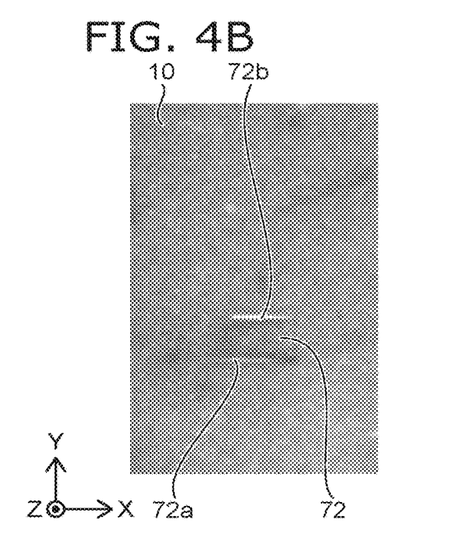

FIG. 4A to FIG. 4D are microscope photographs illustrating the expansion of the stacking fault 72. At the initial stage of the irradiation of the energy beam 75 as shown in FIG. 4A, the basal plane dislocation 71x (the dislocation generated by the propagation of the basal plane dislocation 71 of the base body 10s) is observed. As the irradiation time lengthens as shown in FIG. 4B, the stacking fault 72 expands in the Y-axis direction to have a trapezoidal configuration. For example, the side 72a corresponds to a C-core PD (partial dislocation). A side 72b corresponds to a Si-core PD.

Figure 4C:
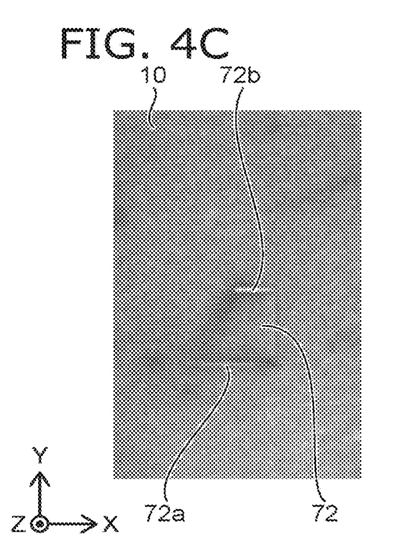
Figure 4D:
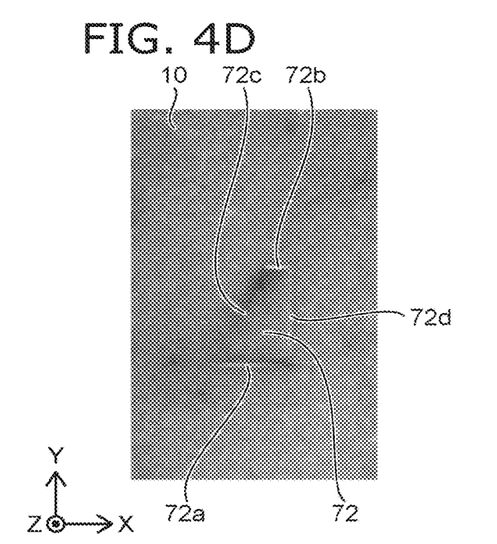

As the irradiation time lengthens further as shown in FIG. 4C, the stacking fault 72 expands further in the Y-axis direction; and the height of the trapezoid lengthens. As the irradiation time lengthens further as shown in FIG. 4D, the stacking fault 72 expands further in the Y-axis direction and becomes substantially triangular. When the stacking fault 72 expands sufficiently, the side 72b (the Si-core PD) disappears or becomes extremely small. Because the mobile Si-core PD disappears or becomes extremely small, the expanded state of the stacking fault 72 is stable; and the state substantially does not change.

Figure 4E:
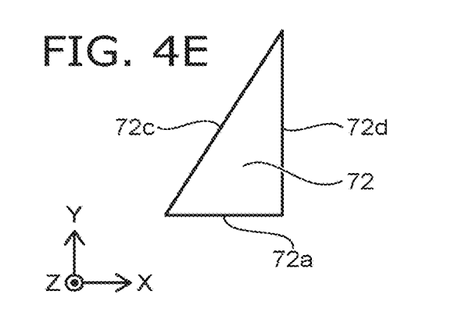

For example, as shown in FIG. 4E, the stacking fault 72 is substantially a triangle in the X-Y plane (when projected onto the X-Y plane). In the triangle, the length of the long side (the side 72d) is substantially 2 times the length of the short side (the side 72a).

There is a reference example in which the first semiconductor layer 10 is not formed and the irradiation is not performed. In the reference example, the second semiconductor layer 20 is epitaxially grown on the base body 10s. In such a case, the stacking fault 72 expands over the entire second semiconductor layer 20 in the thickness direction. For example, the Si-core PD reaches the upper surface of the second semiconductor layer 20. When the third semiconductor layer is formed on such a second semiconductor layer 20, the mobile Si-core PD reaches the interface between the second semiconductor layer 20 and the third semiconductor layer. Therefore, the state of the stacking fault 72 changes when operating; and the characteristics fluctuate easily.

Conversely, in the embodiment, the stacking fault 72 expands inside the first semiconductor layer 10 and substantially does not expand inside the second semiconductor layer 20. Also, the mobile Si-core PD disappears or becomes extremely small. Therefore, the fluctuation of the characteristics is suppressed.

FIG. 5A to FIG. 5E are schematic views illustrating states of the semiconductor device.

FIG. 5A to FIG. 5D are schematic plan views illustrating states of the stacking fault 72 obtained after the first process. FIG. 5E illustrates crystal orientations. In the case where the angle θ recited above (referring to FIG. 3D) is small, e.g., 10 degrees or less, the apical angle of the triangle of the stacking fault 72 may be considered to be 30 degrees when viewed along the Z-axis direction.

Figure 5A:
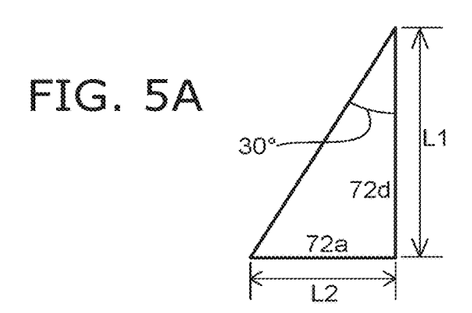
FIG. 5A to FIG. 5E are schematic views illustrating states of the semiconductor device.
Figure 5B:
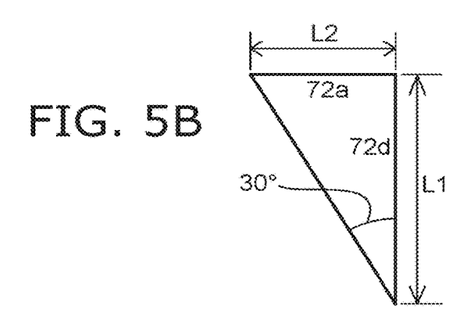

FIG. 5A and FIG. 5B illustrate states in which the stacking fault 72 has expanded sufficiently. In such a case, the stacking fault 72 is substantially a triangle. A length L1 of the long side of the triangle is substantially 2 times a length L2 of the short side.

Figure 5C:
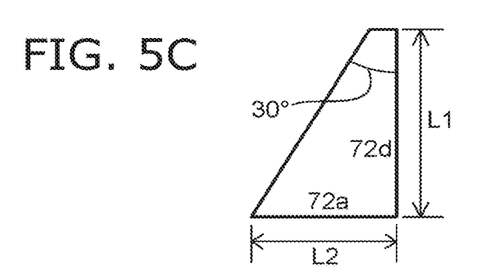
Figure 5D:
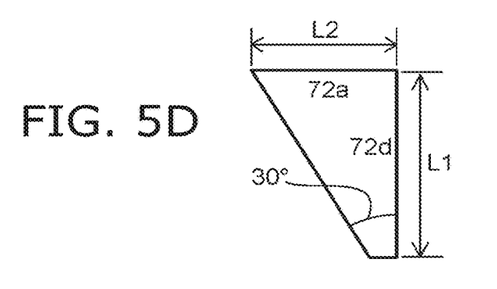
Figure 5E:
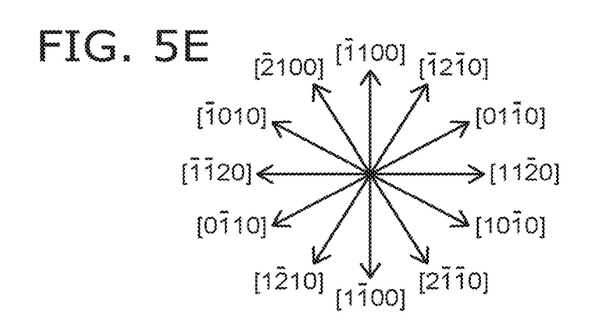

FIG. 5C and FIG. 5D illustrate intermediate states of the expansion of the stacking fault 72. In such a case, the stacking fault 72 is a trapezoid. In the embodiment, the planar configuration of the stacking fault 72 may be a trapezoid. The length L1 of the long side of the trapezoid is, for example, not less than 1.6 times and not more than 2 times the length L2 of the short side.

In the embodiment, for example, a growth mode in which step-flow is predominant is applied to the second process (step S120; the formation of the second semiconductor layer 20). For example, for the source gas used to form the second semiconductor layer 20, the ratio (C/Si) of the number of carbon atoms included in the source gas to the number of silicon atoms included in the source gas is set to be relatively low. In the embodiment, the ratio (C/Si) is, for example, 0.8 or less. Thereby, step-flow is predominant; and the propagation of the basal plane dislocation 71 into the second semiconductor layer 20 is suppressed. The basal plane dislocation may be converted into a threading edge dislocation by processing in an atmosphere including hydrogen. The basal plane dislocations 71 decrease thereby.

In the embodiment, for example, the first process (the irradiation) is performed at 450° C. or less. For example, when the irradiation is performed at a high temperature, there are cases where the expansion of the stacking fault 72 becomes unstable; and the expanded stacking fault 72 contracts. Due to the irradiation at the low temperature, the expansion of the stacking fault 72 is stable. The contraction is suppressed.

In the embodiment, each step illustrated in FIG. 1 may be performed continuously in one processing chamber (chamber). For example, when the process of forming the first semiconductor layer 10 on the base body 10s (step S105) is performed, the process of forming the first semiconductor layer 10 is performed inside a first processing chamber. The first process (step S110) may be performed in the first processing chamber. The second process (step S120) may be performed in the first processing chamber. Thereby, the contamination of the surfaces of the layers, etc., are suppressed; and good crystal quality is obtained. The third process (step S130) may be performed in the first processing chamber.

For example, these processes may be performed continuously at reduced pressure. For example, the process of forming the first semiconductor layer 10 (step S105), the first process (step S110), and the second process (step S120) may be performed at reduced pressure without returning to atmospheric pressure. Also, the third process (step S130) may be performed continuously with the second process at reduced pressure without returning to atmospheric pressure.

In the embodiment, the thickness of the first semiconductor layer 10 is, for example, not more than ½ of the thickness of the second semiconductor layer 20. The stacking fault 72 expands in the first semiconductor layer 10. If the thickness of the first semiconductor layer 10 is excessively thick, the surface area of the stacking fault 72 after the expansion is large. By setting the first semiconductor layer 10 to be thin, the surface area of the stacking fault 72 after the expansion can be reduced. The effects on the characteristics can be suppressed thereby.

For example, the thickness of the first semiconductor layer 10 is not less than 100 nm and not more than 2 µm. The thickness of the second semiconductor layer 20 is not less than 3 µm and not more than 100 µm.

In the embodiment, for example, the first process includes the expansion of the stacking fault 72. For example, the first process includes the irradiation of the energy beam 75. As described above, the energy beam 75 includes at least one selected from the group consisting of an ultraviolet ray and an electron beam. For example, the energy beam 75 is emitted from a mercury-xenon lamp. For example, the energy beam 75 may be emitted from a helium-cadmium laser.

In the embodiment, the first semiconductor layer 10 is epitaxially grown on the base body 10s. The second process includes epitaxially growing the second semiconductor layer 20 on the first semiconductor layer 10. The manufacturing method according to the embodiment may further include a process of forming a first electrode that is electrically connected to the second semiconductor layer 20, and a second electrode that is electrically connected to the third semiconductor layer (step S140). Examples of these electrodes are described below.

Second Embodiment

A second embodiment relates to a method for manufacturing a substrate.

The manufacturing method includes the first process (step S110 of FIG. 1) and the second process (step S120 of FIG. 1). As described above, in the first process, at least one selected from the group consisting of an ultraviolet ray and an electron beam (e.g., the energy beam 75) is irradiated on the first semiconductor layer 10. The stacking fault 72 is caused to expand by the irradiation. The first semiconductor layer 10 is provided on a base body including silicon carbide. The first semiconductor layer 10 includes silicon carbide, and the first element including at least one selected from the group consisting of N, P, and As.

In the second process, the second semiconductor layer 20 is formed on the first semiconductor layer 10 after the first process. The second semiconductor layer 20 includes silicon carbide and the first element.

According to such a manufacturing method, the stacking fault 72 can be caused to expand inside the first semiconductor layer 10 in the first process. The stacking fault 72 can be in a stable state.

According to the embodiment, a method for manufacturing a substrate is obtained in which the characteristics can be stable. By using a substrate obtained by such a manufacturing method, for example, a semiconductor device can be manufactured by forming the third semiconductor layer, etc.

Third Embodiment

A third embodiment relates to a semiconductor device.

Figure 6:
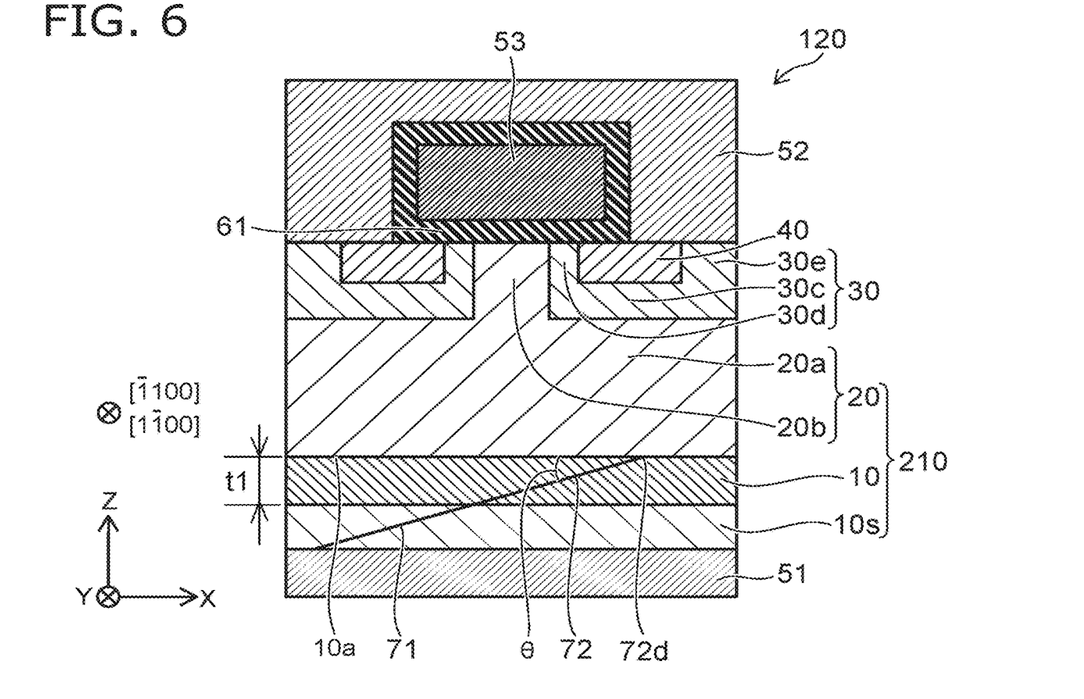
FIG. 6 is a schematic cross-sectional view illustrating a semiconductor device according to the third embodiment.

FIG. 6 is a schematic cross-sectional view illustrating the semiconductor device according to the third embodiment.

As shown in FIG. 6, the semiconductor device 120 according to the embodiment includes the first semiconductor layer 10, the second semiconductor layer 20, and the third semiconductor layer 30.

The first semiconductor layer 10 includes silicon carbide and the first element. The first element includes at least one selected from the group consisting of N, P, and As. The first semiconductor layer 10 is n-type SiC. The second semiconductor layer 20 includes silicon carbide and the first element.

The second semiconductor layer 20 is n-type SiC. The third semiconductor layer 30 includes silicon carbide and the second element. The second element includes at least one selected from the group consisting of B, Al, and Ga. The third semiconductor layer 30 is p-type SiC. The second semiconductor layer 20 is between the first semiconductor layer 10 and the third semiconductor layer 30.

The first semiconductor layer 10 includes the stacking fault 72. The stacking fault 72 has a first side (the side 72d). The first side is aligned with the <-1100> direction (the [-1100] direction or the [1-100] direction). As shown in FIG. 5A to FIG. 5E, the first side (the side 72d) is aligned with the [-1100] direction or the [1-10] direction. As shown in FIG. 6, the first side (the side 72d) contacts the second semiconductor layer 20.

In the semiconductor device 120, the stacking fault 72 inside the first semiconductor layer 10 expands; and the first side (the side 72d) is in a state of contacting the second semiconductor layer 20. The stacking fault 72 is immobilized. In the semiconductor device 120, for example, further expansion of the stacking fault 72 substantially does not occur. For example, a stable forward voltage Vf is obtained.

In the embodiment, the stacking fault 72 further includes the side 72a in addition to the first side (the side 72d) (referring to FIG. 5A to FIG. 5D). As described above, the length of the side 72d is not less than 1.6 times and not more than 2 times the length of the side 72a.

In the embodiment, the first semiconductor layer 10 has the first surface 10a opposing the second semiconductor layer 20. The angle between the first surface 10a and the {0001} plane is taken as the angle θ. The angle θ corresponds to the angle between the first surface 10a and the basal plane dislocation 71.

The first semiconductor layer 10 has a thickness t1. The thickness t1 corresponds to the thickness in the first direction (the Z-axis direction) perpendicular to the first surface 10a.

The length along the first surface 10a of the first side (the side 72d) is taken as a first length. For example, the first length corresponds to the length L1 of the long side illustrated in FIG. 5A. The first length is not more than $2 \times t1/(\tan(\theta))$. The first length is not more than $2 \times t1/(\tan(\theta))$. This corresponds to the stacking fault 72 stopping inside the first semiconductor layer 10 and not expanding inside the second semiconductor layer 20.

As described above, for example, the stacking fault 72 may have a trapezoidal configuration in which the expansion is in an intermediate stage. In such a case, the first length is shorter than $2 \times t1/(\tan(\theta))$. For example, the first length is not less than 0.8 times and not more than 1 times $2 \times t1/(\tan(\theta))$.

The stacking fault 72 has a second side aligned with the <11-20> direction. The second side corresponds to the side 72a. As shown in FIG. 5A to FIG. 5D, the side 72a is aligned with the [11-20] direction or the [-1-120] direction.

The length along the first surface 10a of the second side (the side 72a) is taken as a second length. The second length corresponds to the length L2 of the short side illustrated in FIG. 5A. The second length is not more than $t1/(\tan(\theta))$.

The stacking fault 72 may have a trapezoidal configuration. In such a case, the second length is not less than 0.8 times and not more than 1 times $t1/(\tan(\theta))$.

Such a stacking fault 72 is substantially immobilized. Stable characteristics are obtained.

In the embodiment, the semiconductor device 120 may further include the base body 10s. The base body 10s includes silicon carbide. The first semiconductor layer 10 is between the base body 10s and the second semiconductor layer 20. For example, the concentration of the first element in the first semiconductor layer 10 is between the concentration of the first element in the base body 10s and the concentration of the first element in the second semiconductor layer 20.

For example, the concentration of the first element in the base body 10s is, for example, not less than $2 \times 10^{18}$ cm$^{-3}$ and not more than $8 \times 10^{18}$ cm$^{-3}$ (e.g., about $5 \times 10^{18}$ cm$^{-3}$).

For example, the concentration of the first element in the first semiconductor layer 10 is, for example, not less than $2 \times 10^{17}$ cm$^{-3}$ and not more than $8 \times 10^{17}$ cm$^{-3}$ (e.g., about $5 \times 10^{17}$ cm$^{-3}$).

For example, the concentration of the first element in the second semiconductor layer 20 is, for example, not less than $1 \times 10^{15}$ cm$^{-3}$ and not more than $2 \times 10^{16}$ cm$^{-3}$ (e.g., about $3 \times 10^{15}$ cm$^{-3}$).

As shown in FIG. 6, the semiconductor device 120 may further include a first electrode 51, a second electrode 52, a third electrode 53, an insulating portion 61, and a fourth semiconductor layer 40. The fourth semiconductor layer 40 includes, for example, n-type SiC.

The first electrode 51 is electrically connected to the first semiconductor layer 10. The second electrode 52 is electrically connected to the third semiconductor layer 30.

The second semiconductor layer 20 is, for example, a drift layer. The second semiconductor layer 20 includes a first partial region 20a and a second partial region 20b. The direction from the second partial region 20b toward the first partial region 20a crosses the first direction (the Z-axis direction).

A portion of the third semiconductor layer 30 is between the first partial region 20a and the fourth semiconductor layer 40 in the first direction. The third semiconductor layer 30 includes a third partial region 30c, a fourth partial region 30d, and a fifth partial region 30e. The third partial region 30c is between the fourth semiconductor layer 40 and the first partial region 20a in the first direction. The fourth semiconductor layer 40 is between the second partial region 20b and the fifth partial region 30e in a direction crossing the first direction (the Z-axis direction). The fourth partial region 30d is between the second partial region 20b and the fourth semiconductor layer 40 in a direction crossing the first direction (the Z-axis direction).

The direction from the second partial region 20b toward the third electrode 53 is aligned with the first direction (the Z-axis direction). At least a portion of the insulating portion 61 is between the second partial region 20b and the third electrode 53.

The first electrode 51 is, for example, a drain electrode. The second electrode 52 is, for example, a source electrode. The third electrode 53 is, for example, a gate electrode. The insulating portion 61 is, for example, a gate insulating film. In the case where the base body 10s is of the n-type, the semiconductor device 120 is a MOSFET.

Figure 7:
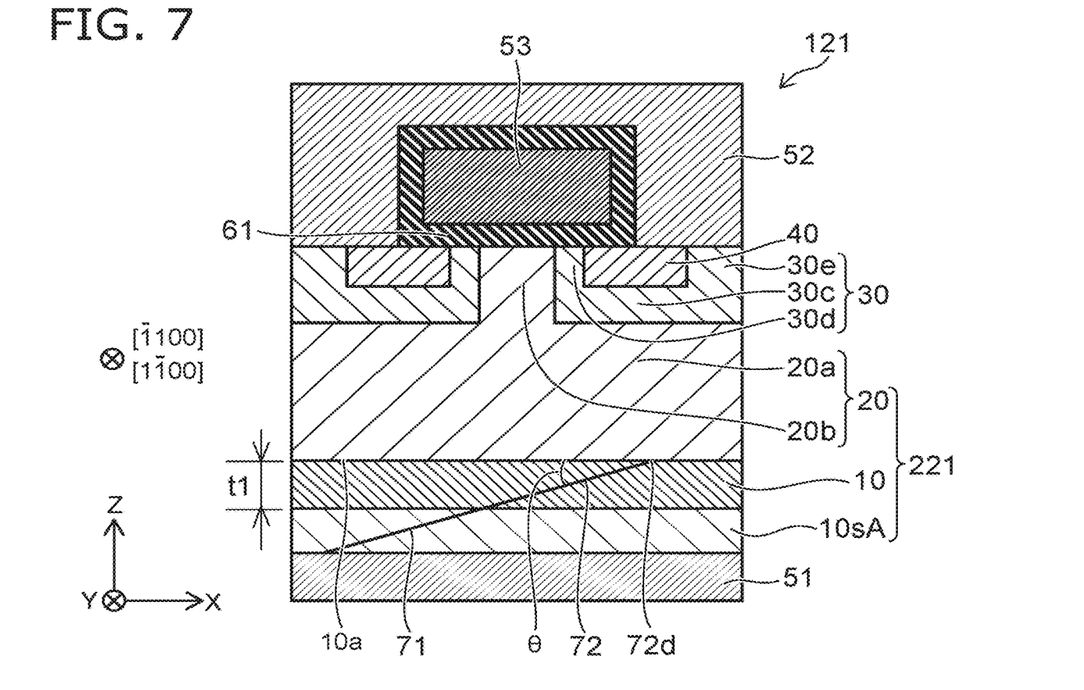
FIG. 7 is a schematic cross-sectional view illustrating a semiconductor device according to the third embodiment.

FIG. 7 is a schematic cross-sectional view illustrating a semiconductor device according to the third embodiment.

In the semiconductor device 121 according to the embodiment as shown in FIG. 7, a base body 10s A is of the p-type. Otherwise, the configuration of the semiconductor device 121 is the same as the configuration of the semiconductor device 120. The semiconductor device 121 is, for example, an IGBT (Insulated Gate Bipolar Transistor).

Figure 8:
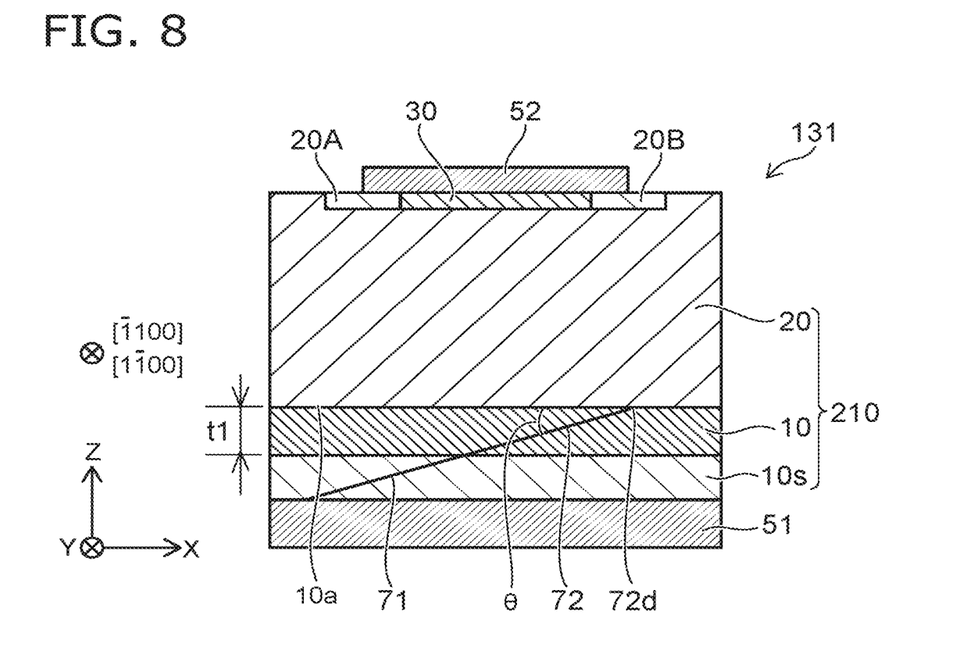
FIG. 8 is a schematic cross-sectional view illustrating a semiconductor device according to the third embodiment.

FIG. 8 is a schematic cross-sectional view illustrating a semiconductor device according to the third embodiment.

As shown in FIG. 8, the semiconductor device 131 according to the embodiment includes the first semiconductor layer 10, the second semiconductor layer 20, the third semiconductor layer 30, the first electrode 51, and the second electrode 52. The semiconductor device 131 is a p-n junction diode.

In the example, a junction terminal region 20A is provided between the second semiconductor layer 20 and one end portion of the second electrode 52. A junction terminal region 20B is provided between the second semiconductor layer 20 and another end portion of the second electrode 52. The first electrode 51 is, for example, a cathode electrode. The second electrode 52 is, for example, an anode electrode.

The stacking fault 72 is immobilized in the semiconductor devices (e.g., the semiconductor devices 120, 121, and 131, etc.) according to the embodiments. For example, a stable forward voltage Vf is obtained. According to the embodiments, a semiconductor device can be provided in which the characteristics can be stable.

In the embodiments, at least one of the first electrode 51 or the second electrode 52 includes, for example, at least one selected from the group consisting of Al, Cu, and Au. For example, the third electrode 53 (e.g., the gate electrode) includes at least one selected from the group consisting of TiN, Al, Ru, W, and TaSiN. The insulating portion 61 includes, for example, at least one selected from the group consisting of silicon oxide, silicon nitride, silicon oxynitride, aluminum oxide, and hafnium oxide.

Fourth Embodiment

A fourth embodiment relates to a substrate. The substrate is, for example, a substrate including SiC. The base body 10s (or the base body 10s A), the first semiconductor layer 10, and the second semiconductor layer 20 illustrated in FIG. 6 to FIG. 8 are included in a substrate 210 (or a substrate 211) according to the embodiment.

The substrate 210 (or the substrate 211) include the base body 10s (or the base body 10sA) including silicon carbide, the first semiconductor layer 10 recited above, and the second semiconductor layer 20 recited above. The stacking fault 72 of the first semiconductor layer 10 has the first side (e.g., the side 72d) aligned with the <–1100> direction. The first side contacts the second semiconductor layer 20.

In such a case as well, the first length (e.g., the length L1) that is aligned with the first surface 10a of the first side is, for example, not more than $2 \times t1/(\tan(\theta))$. The first length (e.g., the length L1) may be, for example, not less than 0.8 times and not more than 1 times $2 \times t1/(\tan(\theta))$.

The second length (e.g., the length L2) that is aligned with the first surface 10a of the second side is, for example, not more than $t1/(\tan(\theta))$. The second length (e.g., the length L2) may be, for example, not less than 0.8 times and not more than 1 times $t1/(\tan(\theta))$.

Fifth Embodiment

A fifth embodiment relates to a manufacturing apparatus of a substrate. The manufacturing apparatus of the substrate may be the manufacturing apparatus of a semiconductor device.

Figure 9:
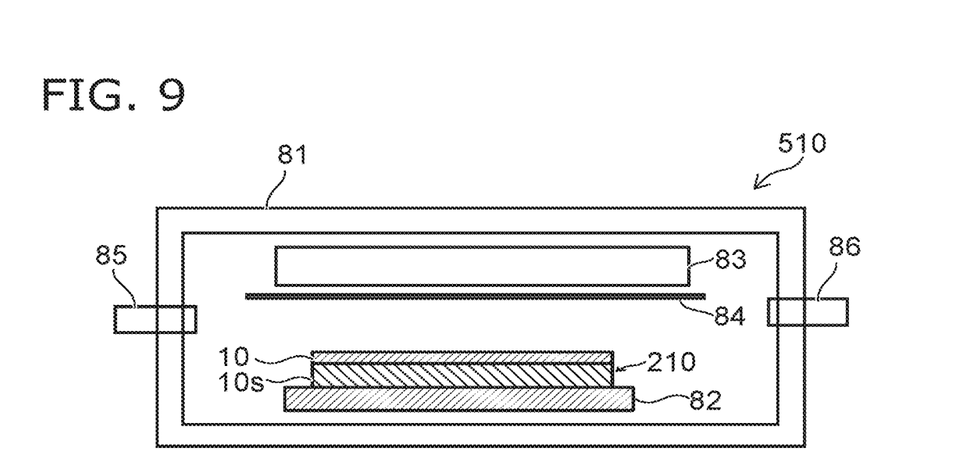
FIG. 9 is a schematic cross-sectional view illustrating the manufacturing apparatus of the substrate according to the fifth embodiment.

FIG. 9 is a schematic cross-sectional view illustrating the manufacturing apparatus of the substrate according to the fifth embodiment.

As shown in FIG. 9, the manufacturing apparatus 510 of the substrate according to the embodiment includes a processing chamber 81, a stage 82, and an irradiation portion 83.

The processing chamber 81 includes an inlet 85. The inlet 85 is configured to introduce a source gas of silicon carbide.

The processing chamber 81 may further include an outlet 86. The stage 82 is provided inside the processing chamber 81. A processing body (e.g., the substrate 210) that includes the first semiconductor layer 10 is placed on the stage 82. The processing body includes, for example, the base body 10s, and the first semiconductor layer 10 provided on the base body 10s.

The irradiation portion 83 is configured to irradiate at least one selected from the group consisting of an ultraviolet ray and an electron beam (e.g., the energy beam 75) on the first semiconductor layer 10 at a first temperature of 450° C. or less. By irradiating the energy beam 75 on the first semiconductor layer 10, for example, the stacking fault 72 is caused to expand. The stacking fault 72 can be stabilized.

The irradiation portion 83 includes, for example, a mercury-xenon lamp, a helium-cadmium laser, etc. The wavelength of the energy beam 75 is, for example, 380 nm or less. The irradiation portion 83 may include a filter, etc.

A layer that includes silicon carbide may be formed using a source gas introduced from the inlet 85. The layer that includes silicon carbide includes, for example, at least one of the first semiconductor layer 10, the second semiconductor layer 20, or the third semiconductor layer 30. The temperature of the formation (the growth) of these layers is higher than the first temperature recited above. Layers having high crystal quality are obtained by the growth at the high temperature.

A shutter 84 may be provided as shown in FIG. 9. The irradiation is controlled by the shutter 84. The irradiation portion 83 may be protected by the shutter 84 when forming the layer including silicon carbide.

According to the manufacturing apparatus 510 according to the embodiment, for example, the process of forming the first semiconductor layer 10, the first process, and the second process can be performed at reduced pressure without returning to atmospheric pressure. Layers having good quality are obtained.

In the embodiments, the information that relates to the crystal orientation is obtained by, for example, X-ray diffraction analysis, etc. The information that relates to the basal plane dislocation 71 is obtained by, for example, at least one of X-ray topography or photoluminescence imaging.

In the embodiments, the information that relates to the impurity concentration is obtained by, for example, SIMS (Secondary Ion Mass Spectrometry), etc. In the description recited above, the impurity concentration may be, for example, the carrier concentration. For example, the information that relates to the relative level of the impurity concentration can be obtained based on information relating to the relative level of the carrier concentration obtained by SCM (Scanning Capacitance Microscopy).

According to the embodiments, a method for manufacturing a semiconductor device, a method for manufacturing a substrate, a semiconductor device, a substrate, and a manufacturing apparatus of a substrate can be provided in which the characteristics can be stable.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor layers, base bodies, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all methods for manufacturing semiconductor devices, methods for manufacturing substrates, semiconductor devices, base bodies, and manufacturing apparatuses of substrates practicable by an appropriate design modification by one skilled in the art based on the methods for manufacturing semiconductor devices, the methods for manufacturing substrates, the base bodies, and the manufacturing apparatuses of substrates described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:
   a first process of causing a stacking fault of a first semiconductor layer to expand, the first semiconductor layer including silicon carbide and a first element and being provided on a base body including silicon carbide, the first element including at least one selected from the group consisting of N, P, and As;
   a second process of forming a second semiconductor layer on the first semiconductor layer after the first process while maintaining a size of the stacking fault after expanded, the second semiconductor layer including silicon carbide and the first element; and
   a third process of forming a third semiconductor layer on the second semiconductor layer, the third semiconductor layer including silicon carbide and a second element, the second element including at least one selected from the group consisting of B, Al, and Ga.

2. The method according to claim 1, wherein the first process includes irradiating at least one selected from the group consisting of an ultraviolet ray and an electron beam on the first semiconductor layer.

3. The method according to claim 2, wherein the irradiating is performed at 450° C. or less.

4. The method according to claim 1, further comprising forming the first semiconductor layer on the base body,
   the forming of the first semiconductor layer being performed inside a first processing chamber,
   the first process being performed in the first processing chamber,
   the second process being performed in the first processing chamber.

5. The method according to claim 1, further comprising forming the first semiconductor layer on the base body,
   the forming of the first semiconductor layer, the first process, and the second process being performed at reduced pressure without returning to atmospheric pressure.

6. The method according to claim 1, wherein a thickness of the first semiconductor layer is not more than ½ of a thickness of the second semiconductor layer.

7. The method according to claim 1, wherein
   the first semiconductor layer is epitaxially grown on the base body, and
   the second process includes epitaxially growing the second semiconductor layer on the first semiconductor layer.

8. The method according to claim 1, further comprising:
   forming a first electrode electrically connected to the second semiconductor layer; and
   forming a second electrode electrically connected to the third semiconductor layer.

9. The method according to claim 1, wherein the second process is performed without shrinking the stacking fault after the first process.

10. The method according to claim 1, wherein a Si-core partial dislocation disappears at an end portion of stacking fault after the first process.

11. A method for manufacturing a semiconductor device, comprising:
    a first process of irradiating at least one selected from the group consisting of an ultraviolet ray and an electron beam on a first semiconductor layer provided on a base body including silicon carbide, the first semiconductor layer including silicon carbide and a first element, the first element including at least one selected from the group consisting of N, P, and As;
    a second process of forming a second semiconductor layer on the first semiconductor layer after the first process while maintaining a size of the stacking fault after expanded, the second semiconductor layer including silicon carbide and the first element; and
    a third process of forming a third semiconductor layer on the second semiconductor layer, the third semiconductor layer including silicon carbide and a second element, the second element including at least one selected from the group consisting of B, Al, and Ga.

12. A method for manufacturing a substrate, comprising:
    a first process of irradiating at least one selected from the group consisting of an ultraviolet ray and an electron beam on a first semiconductor layer provided on a base body including silicon carbide, the first semiconductor layer including silicon carbide and a first element, the first element including at least one selected from the group consisting of N, P, and As; and
    a second process of forming a second semiconductor layer on the first semiconductor layer after the first process while maintaining a size of the stacking fault after expanded, the second semiconductor layer including silicon carbide and the first element.

* * * * *